(12) United States Patent
Wang et al.

(10) Patent No.: US 11,190,160 B2
(45) Date of Patent: Nov. 30, 2021

(54) FREQUENCY MULTIPLEXER

(71) Applicant: ANHUI ANUKI TECHNOLOGIES CO., LTD., Anhui (CN)

(72) Inventors: Xiaodong Wang, Anhui (CN); Chengjie Zuo, Anhui (CN); Jun He, Anhui (CN)

(73) Assignee: ANHUI ANUKI TECHNOLOGIES CO., LTD., Anhui (CN)

( * ) Notice: Subject to any disclaimer, the term of this patent is extended or adjusted under 35 U.S.C. 154(b) by 0 days.

(21) Appl. No.: 16/764,279

(22) PCT Filed: Mar. 8, 2019

(86) PCT No.: PCT/CN2019/077494
§ 371 (c)(1),
(2) Date: May 14, 2020

(87) PCT Pub. No.: WO2020/098185
PCT Pub. Date: May 22, 2020

(65) Prior Publication Data
US 2021/0226601 A1 Jul. 22, 2021

(30) Foreign Application Priority Data

Nov. 16, 2018 (CN) .......................... 201811367716.X
Nov. 16, 2018 (CN) .......................... 201821907531.9

(51) Int. Cl.
*H03H 7/01* (2006.01)
*H01F 17/00* (2006.01)
(Continued)

(52) U.S. Cl.
CPC ....... *H03H 7/0115* (2013.01); *H01F 27/2804* (2013.01); *H01P 1/213* (2013.01);
(Continued)

(58) Field of Classification Search
CPC .................. H01P 1/213; H03H 7/0115; H01F 2017/0026; H01F 27/2804
(Continued)

(56) References Cited

U.S. PATENT DOCUMENTS

2004/0046621 A1\* 3/2004 Furuya .................... H01P 1/213
333/132

FOREIGN PATENT DOCUMENTS

CN         1798474 A       7/2006
CN       201430202 Y       3/2010
(Continued)

OTHER PUBLICATIONS

International Search Report, PCT/CN2019/077494, dated Jun. 12, 2019.

*Primary Examiner* — Rakesh B Patel
(74) *Attorney, Agent, or Firm* — Greenberg Traurig

(57) ABSTRACT

Provided is a frequency multiplexer. The frequency multiplexer includes a stacked structure. The stacked structure includes at least one insulating layer and a plurality of metal layers arranged alternately along a stacked direction. The stacked structure forms at least one first inductive element and at least one capacitive element. At least two of the plurality of metal layers are provided with respective first patterned metal structures. The first patterned metal structures in the at least two of the plurality of metal layers are electrically connected to form a first multilayer planar spiral coil structure. The first multilayer planar spiral coil structure constitutes the first inductive element.

9 Claims, 5 Drawing Sheets

(51) Int. Cl.
  *H01F 27/28* (2006.01)
  *H01P 1/213* (2006.01)
(52) U.S. Cl.
  CPC ............... *H01F 2017/0026* (2013.01); *H01F 2027/2809* (2013.01)
(58) Field of Classification Search
  USPC ................................................ 333/175, 185
  See application file for complete search history.

(56) References Cited

FOREIGN PATENT DOCUMENTS

| | | |
|---|---|---|
| CN | 102087996 A | 6/2011 |
| CN | 202102827 U | 1/2012 |
| CN | 109361042 A | 2/2019 |
| JP | 2004281847 | 10/2004 |
| WO | 2052724 | 7/2002 |

* cited by examiner

FREQUENCY MULTIPLEXER

The present application is a national phase application under 35 U.S.C. § 371 of International Patent Application PCT/CN2019/077494, filed on Mar. 8, 2019, which claims priority to Chinese patent applications No. 201811367716.X and No. 201821907531.9 filed with China patent office on Nov. 16, 2018, disclosures of which applications are incorporated herein by reference in their entireties.

TECHNICAL FIELD

The present disclosure relates to the technical field of microwave communication electronic devices and, for example, relates to a frequency multiplexer.

BACKGROUND

A frequency multiplexer is an important part of an antenna and communication electronic equipment. The frequency multiplexer is crucial to the performance of a system. The frequency multiplexer usually sorts received signals into corresponding channels according to frequencies of the received signals. That is, a working principle of the frequency multiplexer is to sort input broadband signals into required signals in different frequency bands for output, so as to implement signal reception and interference suppression.

In addition, with an increasing requirement of users for miniaturization of electronic products, integration level of the electronic products is gradually improved, which puts forward a higher requirement for the size of electronic elements included in the electronic products. It is required to take into account the miniaturization and electrical performance of the electronic elements. As a decisive factor in determination of the loss of the frequency multiplexer, the size and electrical performance of inductive elements directly affect the size and performance of the frequency multiplexer. This makes it very important to take into account the miniaturization and electrical performance of the inductive elements in frequency multiplexer.

SUMMARY

The present disclosure provides a frequency multiplexer. The frequency multiplexer is beneficial to miniaturization of a first inductive element and then miniaturization of the frequency multiplexer. At the same time, the frequency multiplexer is beneficial to precise control of the size of the first inductive element, increase of precision of inductance of the first inductive element, increase of conductivity of the first inductive element, reduction of resistance of the first inductive element, increase of a Q value (quality factor) of the first inductive element in the frequency multiplexer and reduction of the loss of the frequency multiplexer.

An embodiment of the present disclosure provides a frequency multiplexer. The frequency multiplexer includes a stacked structure.

The stacked structure includes at least one insulating layer and a plurality of metal layers arranged alternately along a stacked direction in the order of one metal layer and one insulating layer. The stacked structure forms at least one first inductive element and at least one capacitive element.

At least two of the plurality of metal layers are provided with respective first patterned metal structures. The first patterned metal structures in the at least two of the plurality of metal layers are electrically connected to form a first multilayer planar spiral coil structure. The first multilayer planar spiral coil structure constitutes the first inductive element.

In an embodiment, the first multilayer planar spiral coil structure includes a plurality of first monolayer planar spiral coil structures along an axial direction of the first multilayer planar spiral coil structure. A thickness of a first dielectric structure between two adjacent first monolayer planar spiral coil structures is greater than a thickness of each first monolayer planar spiral coil structure.

In an embodiment, the stacked structure further forms at least one second inductive element.

At least two of the plurality of metal layers are provided with respective second patterned metal structures. The second patterned metal structures in the at least two of the plurality of metal layers are electrically connected to form a second spiral coil structure. The second spiral coil structure constitutes the second inductive element.

The axial direction of the first multilayer planar spiral coil structure intersects with an axial direction of the second spiral coil structure.

In an embodiment, the axial direction of the first multilayer planar spiral coil structure is perpendicular to the axial direction of the second spiral coil structure.

In an embodiment, the first inductive element is configured in a first branch of the frequency multiplexer, and the second inductive element is configured in a second branch of the frequency multiplexer.

In an embodiment, the second spiral coil structure is a multilayer spiral coil structure.

In an embodiment, the second spiral coil structure includes a plurality of second monolayer planar spiral coil structures along the axial direction of the second spiral coil structure. A thickness of a second dielectric structure between two adjacent second monolayer planar spiral coil structures is greater than a thickness of each second monolayer planar spiral coil structure.

In an embodiment, the stacked structure further forms at least one third inductive element. A third patterned metal structure in one of the plurality of metal layers forms a third monolayer planar spiral coil structure. The third monolayer planar spiral coil structure constitutes the third inductive element.

In an embodiment, the capacitive element is formed of overlapping part of forth patterned metal structures in two adjacent metal layers of the plurality of metal layers along a direction perpendicular to a plane of the stacked structure.

In an embodiment, the first multilayer planar spiral coil structure includes the plurality of first monolayer planar spiral coil structures along the axial direction of the first multilayer planar spiral coil structure. The first monolayer planar spiral coil structure forms a structure including at least one coil.

The present disclosure provides a frequency multiplexer. The frequency multiplexer includes a stacked structure. The stacked structure includes at least one insulating layer and a plurality of metal layers arranged alternately along the stacked direction in the order of one metal layer and one insulating layer. The stacked structure forms the at least one first inductive element and the at least one capacitive element. At least two of the plurality of metal layers are provided with respective first patterned metal structures. The first patterned metal structures in the at least two of the plurality of metal layers are electrically connected to form the first multilayer planar spiral coil structure. The first multilayer planar spiral coil structure constitutes the first inductive element. In this way, the insulating layer and the plurality of metal layers arranged alternately along the stacked direction in the stacked structure are used for forming the first multilayer plane spiral coil structure, that is, the at least one first inductive element in the frequency multiplexer. This is beneficial to obtaining of larger inductance in smaller size, that is, miniaturization of the first inductive element and then miniaturization of the frequency multiplexer. At the same time, the first inductive element in the frequency multiplexer may be fabricated using a semiconductor process, which is beneficial to precise control of the size of the first inductive element, increase of precision of inductance of the first inductive element, increase of conductance of the first inductive element, reduction of resistance of the first inductive element, increase of Q value of the first inductive element in the frequency multiplexer and reduction of the loss of the frequency multiplexer.

DETAILED DESCRIPTION

Figure 1:
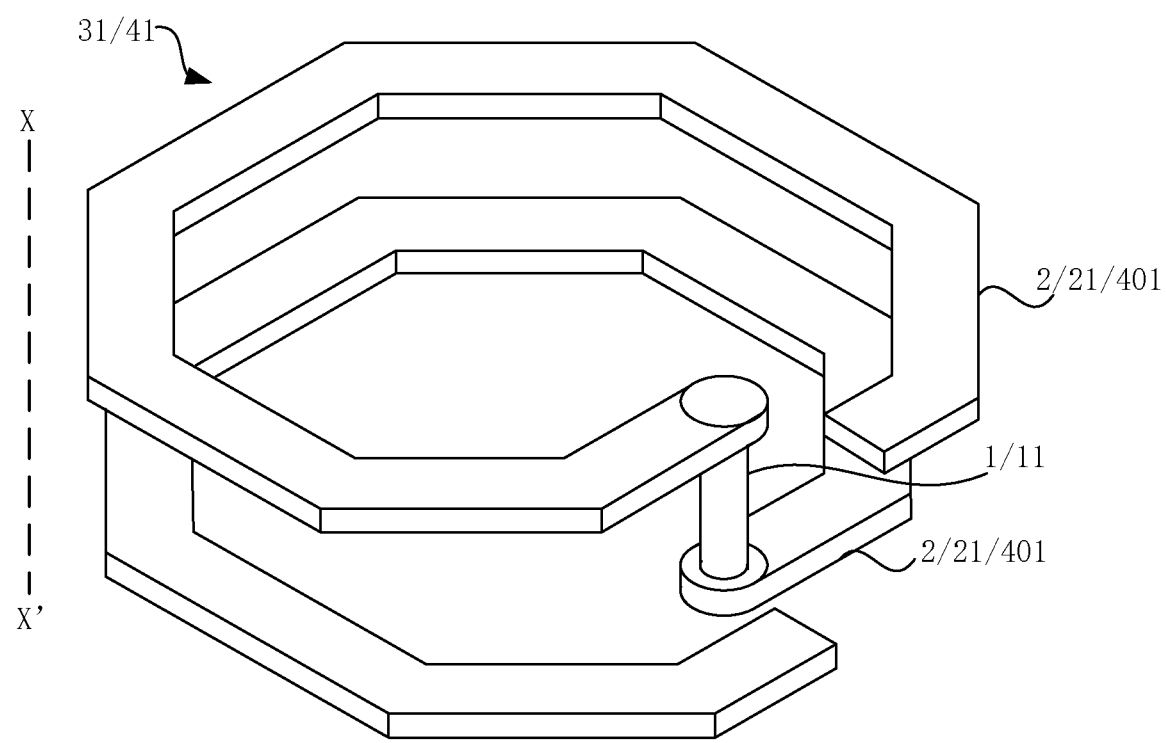
FIG. 1 is a stereoscopic structure diagram of a first inductive element in a frequency multiplexer provided by an embodiment of the present disclosure.

The present disclosure will be further described in detail hereinafter in conjunction with the drawings and embodiments. It may be understood that the specific embodiments described herein are used only for interpreting the present disclosure and not for limiting the present disclosure. In addition, it should be noted that, for ease of description, the drawings show only a part related to the present disclosure, not the whole structure of the present disclosure. Throughout this specification, the same or similar reference number represents the same or similar structure, element or process. It should be noted that the present disclosure and features of the embodiments may be combined with each other without conflict.

An embodiment of the present disclosure provides a frequency multiplexer. The frequency multiplexer includes a stacked structure. The stacked structure includes at least one insulating layer and a plurality of metal layers arranged alternately along a stacked direction in the order of one metal layer and one insulating layer. The stacked structure forms at least one first inductive element and at least one capacitive element. At least two of the plurality of metal layers are provided with respective first patterned metal structures. The first patterned metal structures in the at least two of the plurality of metal layers are electrically connected to form a first multilayer planar spiral coil structure. The first multilayer planar spiral coil structure constitutes the first inductive element.

The frequency multiplexer is an important part of an antenna and communication electronic equipment. The frequency multiplexer is crucial to the performance of a system. The frequency multiplexer usually sorts received signals into corresponding channels according to frequencies of the received signals. That is, a working principle of the frequency multiplexer is to sort input broadband signals into required signals in different frequency bands for output, so as to implement signal reception and interference suppression. In addition, with an increasing requirement of users for miniaturization of electronic products, integration level of the electronic products is gradually improved, which puts forward a higher requirement for the size of electronic elements included in the electronic products. It is required to take into account the miniaturization and electrical performance of the electronic elements. As a decisive factor in determination of the loss of the frequency multiplexer, the size and electrical performance of inductive elements directly affect the size and performance of the frequency multiplexer. This makes it very important to take into account the miniaturization and electrical performance of the inductive elements in frequency multiplexer.

The frequency multiplexer provided by the embodiment of the present disclosure includes a stacked structure. The stacked structure includes at least one insulating layer and a plurality of metal layers arranged alternately along the stacked direction. The stacked structure forms the at least one first inductive element and the at least one capacitive element. At least two of the plurality of metal layers are provided with respective first patterned metal structures. The first patterned metal structures in the at least two of the plurality of metal layers are electrically connected to form the first multilayer planar spiral coil structure. The first multilayer planar spiral coil structure constitutes the first inductive element. In this way, the at least one insulating layer and the plurality of metal layers arranged alternately along the stacked direction in the stacked structure are used for forming the first multilayer plane spiral coil structure, that is, the at least one first inductive element in the frequency multiplexer. This is beneficial to obtaining of larger inductance in smaller size, that is, to miniaturization of the first inductive element and then miniaturization of the frequency multiplexer. At the same time, the first inductive element in the frequency multiplexer may be fabricated using a semiconductor process, which is beneficial to precise control of the size of the first inductive element, increase of precision of inductance of the first inductive element, increase of conductance of the first inductive element, reduction of resistance of the first inductive element, increase of Q value of the first inductive element in the frequency multiplexer and reduction of the loss of the frequency multiplexer.

The present disclosure will be described clearly and completely in conjunction with the drawings in the embodiment of the present disclosure.

FIG. 1 is a stereoscopic structure diagram of a first inductive element in a frequency multiplexer provided by an embodiment of the present disclosure. As shown in FIG. 1, the frequency multiplexer includes a stacked structure. The stacked structure includes at least one insulating layer 1 and at least two metal layers 2. The at least one insulating layer 1 and the at least two metal layers 2 are arranged alternately along a stacked direction XX' in the order of one metal layer and one insulating layer. The stacked structure forms at least one first inductive element 31 and at least one capacitive element. FIG. 1 shows only an example of the first inductive element 31 formed by the stacked structure. The at least two metal layers 2 are provided with respective first patterned metal structures 21. FIG. 1 shows an example of the first patterned metal structures 21 in two metal layers 2. The first patterned metal structures 21 in the two metal layers 2 are electrically connected to form a first multilayer planar spiral coil structure 41. The first multilayer planar spiral coil structure 41 constitutes the first inductive element 31.

As shown in FIG. 1, the stacked structure includes metal layers 2 and an insulating layer 1 arranged alternately along the stacked direction XX'. The insulating layer 1 is used for implementing electrical insulation of a part without electric connection in the first patterned metal structures 21 in the two metal layers 2. A through-hole structure 11 is configured in the insulating layer 1 between the two metal layers 2 provided with the respective first patterned metal structures 21. The first patterned metal structures 21 located in the lower metal layers 2 at upper and lower sides of the insulating layer 1 implement electrical connection through the through-hole structure 11. For example, the first patterned metal structures 21 may be fabricated using a electroplating process, a sputtering process or a process of depositing and etching a metal layer 2. In a case where the first patterned metal structures 21 are fabricated using the electroplating process, a metal film layer with a large thickness may be fabricated using the electroplating process, which is beneficial to improvement of the Q value of the first inductive element 31. In addition, the insulating layer 1 may be formed of a material including polyimide (PI). One insulating layer 1 may be deposited first, and then the through-hole structure 11 may be formed at a set position of the insulating layer 1 through a dry etching process or a laser etching process.

Usually, the inductive elements used in the frequency multiplexer use multilayer co-fired ceramics (MLCC). The MLCC is constituted of ceramic materials with low conductance and a rough manufacturing process, which causes the Q value of the inductive elements to be low, the size of the inductive elements to be controlled imprecisely and the precision of the inductive elements to be low. This affects the performance of the frequency multiplexer and causes the miniaturization of inductive element and the frequency multiplexer to be implemented difficultly. The frequency multiplexer provided by the embodiment of the present disclosure forms the first multilayer planar spiral coil structure 41, that is, the at least one first inductive element 31 in the frequency multiplexer, through using the at least one insulating layer 1 and the plurality of metal layers 2 arranged alternately along the stacked direction XX' in the stacked structure. This is beneficial to obtaining of larger inductance in smaller size, that is, miniaturization of the first inductive element 31 and then miniaturization of the frequency multiplexer. At the same time, the first inductive element 31 in the frequency multiplexer may be fabricated using the semiconductor process, which is beneficial to, on the one hand, precise control of the size of the first inductive element 31, increase of the precision of inductance of the first inductive element 31 to improve the performance of the frequency multiplexer; on the other hand, increase of the conductance of the first inductive element 31, reduction of the resistance of the first inductive element 31, increase of the Q value of the first inductive element 31 in the frequency multiplexer and reduction of the loss of the frequency multiplexer.

In an embodiment, the first multilayer planar spiral coil structure includes a plurality of first monolayer planar spiral coil structures along the axial direction of the first multilayer planar spiral coil structure. A thickness of a first dielectric structure between two adjacent first monolayer planar spiral coil structures may be configured to be greater than a thickness of each first monolayer planar spiral coil structure.

As shown in FIG. 1, the thickness of the first dielectric structure is the thickness of the insulating layer 1 along the axial direction of the first multilayer planar spiral coil structure 41. The thickness of the first dielectric structure is the height of through-hole structure 11 in FIG. 1. Comparing with a configuration where the thickness of each first monolayer planar spiral coil structure is equal to the thickness of the first dielectric structure under the inductive element with the same thickness, a configuration where the thickness of the first dielectric structure between two adjacent first monolayer planar spiral coil structures 401 is greater than the thickness of each first monolayer planar spiral coil structure 401 increases distance between the two adjacent first monolayer planar spiral coil structures 401. This decreases coupling between adjacent first monolayer planar spiral coil structures 401 along the axial direction XX' of the first multilayer planar spiral coil structure 41 due to small distance between the adjacent first monolayer planar spiral coil structures 401, and increases the resonance frequency of the first inductive element 31. For example, the first dielectric structure may be formed of a material including PI. That is, the material constituting the insulating layer 1 may be PI.

As shown in FIG. 1, the first multilayer planar spiral coil structure 41 includes the plurality of the first monolayer planar spiral coil structure 401 along the axial direction XX' of the first multilayer planar spiral coil structure 41. Each first monolayer planar spiral coil structure 401 forms a structure with one turn. The first monolayer planar spiral coil structure 401 may also be configured to form a coil structure with multiple turns, which may obtain the first inductive element 31 with larger inductance in the same size and may be beneficial to the miniaturization of the first inductive element 31 and then the miniaturization of the frequency multiplexer.

Figure 2:
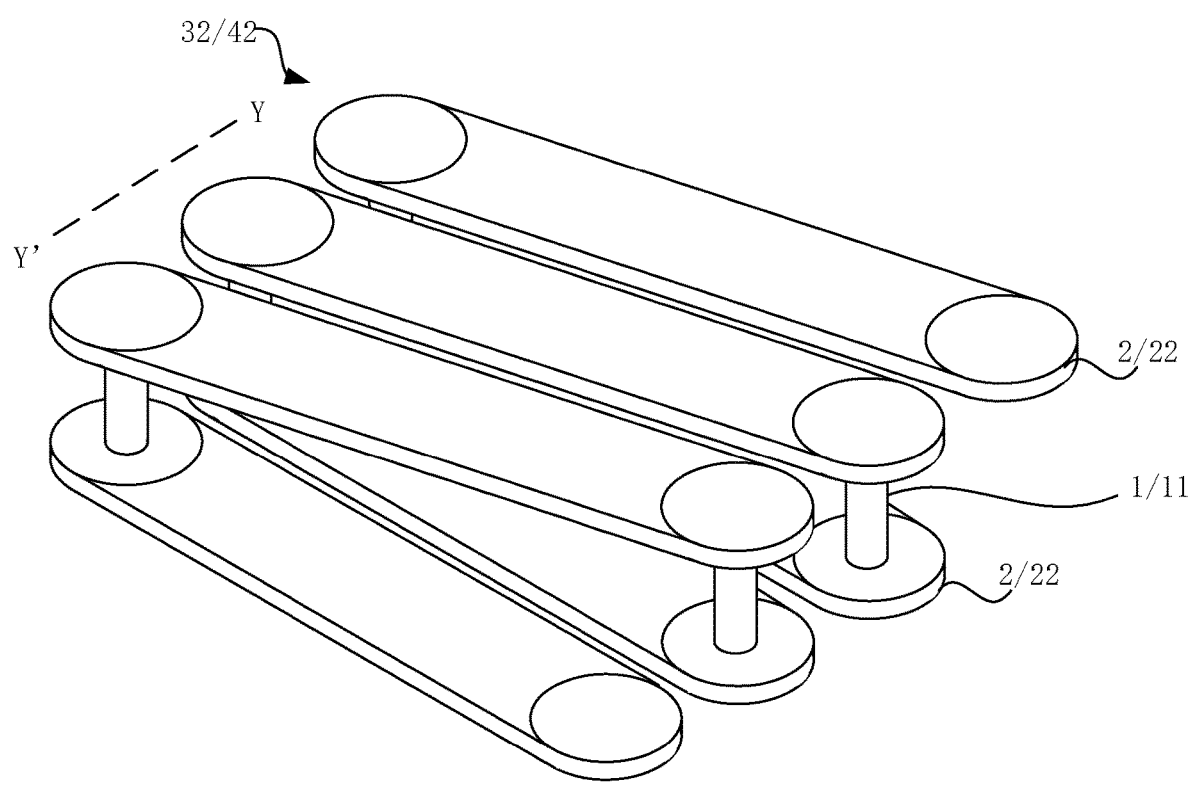
FIG. 2 is a stereoscopic structure diagram of a second inductive element in a frequency multiplexer provided by an embodiment of the present disclosure.

FIG. 2 is a stereoscopic structure diagram of a second inductive element in a frequency multiplexer provided by an embodiment of the present disclosure. As shown in FIG. 2, on the basis of the structure of the first inductive element in the frequency multiplexer shown in FIG. 1, the stacked structure may be further configured to form at least one second inductive element 32. The at least two metal layers 2 are provided with respective second patterned metal structures 22. FIG. 2 shows only an example in which two metal layers 2 are provided with respective second patterned metal structures 22. The second patterned metal structures 22 in the two metal layers 2 are electrically connected to form a second spiral coil structure 42. The second spiral coil structure 42 is the second inductive element 32. Similarly, the second patterned metal structure 22 may be fabricated using the electroplating process, the sputtering process or the process of depositing and etching a metal layer 2. One insulating layer 1 may be deposited first, and then the through-hole structure 11 may be formed at a set position of the insulating layer 1 through the dry etching process or the laser etching process.

Combining with FIG. 1 and FIG. 2, the axial direction XX' of the first multilayer planar spiral coil structure 41 may be configured to intersect with an axial direction YY' of the second spiral coil structure 42. In a case where the axial directions of two inductive elements are parallel, the coupling between the two inductive elements is significant and will seriously affect an out-of-band rejection characteristic of the frequency multiplexer. The axial direction of the first multilayer planar spiral coil structure 41 is configured to intersect with the axial direction of the second spiral coil structure 42, which effectively reduces the coupling between the first multilayer planar spiral coil structure 41 and the second spiral coil structure 42. This is beneficial to increase of the precision of inductance of the first inductive element 31 and the second inductive element 32 to improve the performance of the frequency multiplexer, and increase of the Q values of the first inductive element 31 and the second inductive element 32 in the frequency multiplexer to reduce the loss of the frequency multiplexer. At the same time, the out-of-band rejection characteristic of the frequency multiplexer is optimized. In an embodiment, the axial direction XX' of the first multilayer planar spiral coil 41 and the axial direction YY' of the second spiral coil 42 may be perpendicular to each other to minimize the coupling between the first inductive element 31 and the second inductive element 32 and further optimize the out-of-band rejection characteristic of the frequency multiplexer.

In an embodiment, combining with FIG. 1 and FIG. 2, the first inductive element 31 may be configured in a first branch of the frequency multiplexer, and the second inductive element 32 may be configured in a second branch of the frequency multiplexer. For example, the first branch and the second branch of the frequency multiplexer may be any two different branches of a low-pass branch, a high-pass branch or a band-pass branch. In a case where the first inductive element 31 and the second inductive element 32 are configured in different branches, the coupling between the first multilayer planar spiral coil structure 41 and the second planar spiral coil structure is effectively reduced through configuring the intersection of the axial direction XX' of the first multilayer planar spiral coil structure 41 and the axial direction YY' of the second spiral coil structure 42, the interaction of different branches in the frequency multiplexer and the inability of the frequency multiplexer to precisely process a signal to be processed are avoided and the out-of-band rejection characteristic of the frequency multiplexer is optimized.

In an embodiment, as shown in FIG. 2, the second spiral coil structure 42 may be configured as a multilayer spiral coil structure, which is beneficial to increase of the precision of inductance of the first inductive element and the second inductive element to improve the performance of the frequency multiplexer, and increase of the Q values of the first inductive element and the second inductive element in the frequency multiplexer to reduce the loss of the frequency multiplexer and optimize the out-of-band rejection characteristic of the frequency multiplexer. At the same time, this is beneficial to obtaining of the first inductive element and the second inductive element with larger inductance in smaller size, that is, miniaturization of the first inductive element and the second inductive element and further reduction of the size of the frequency multiplexer to implement the miniaturization of the frequency multiplexer.

Figure 3:
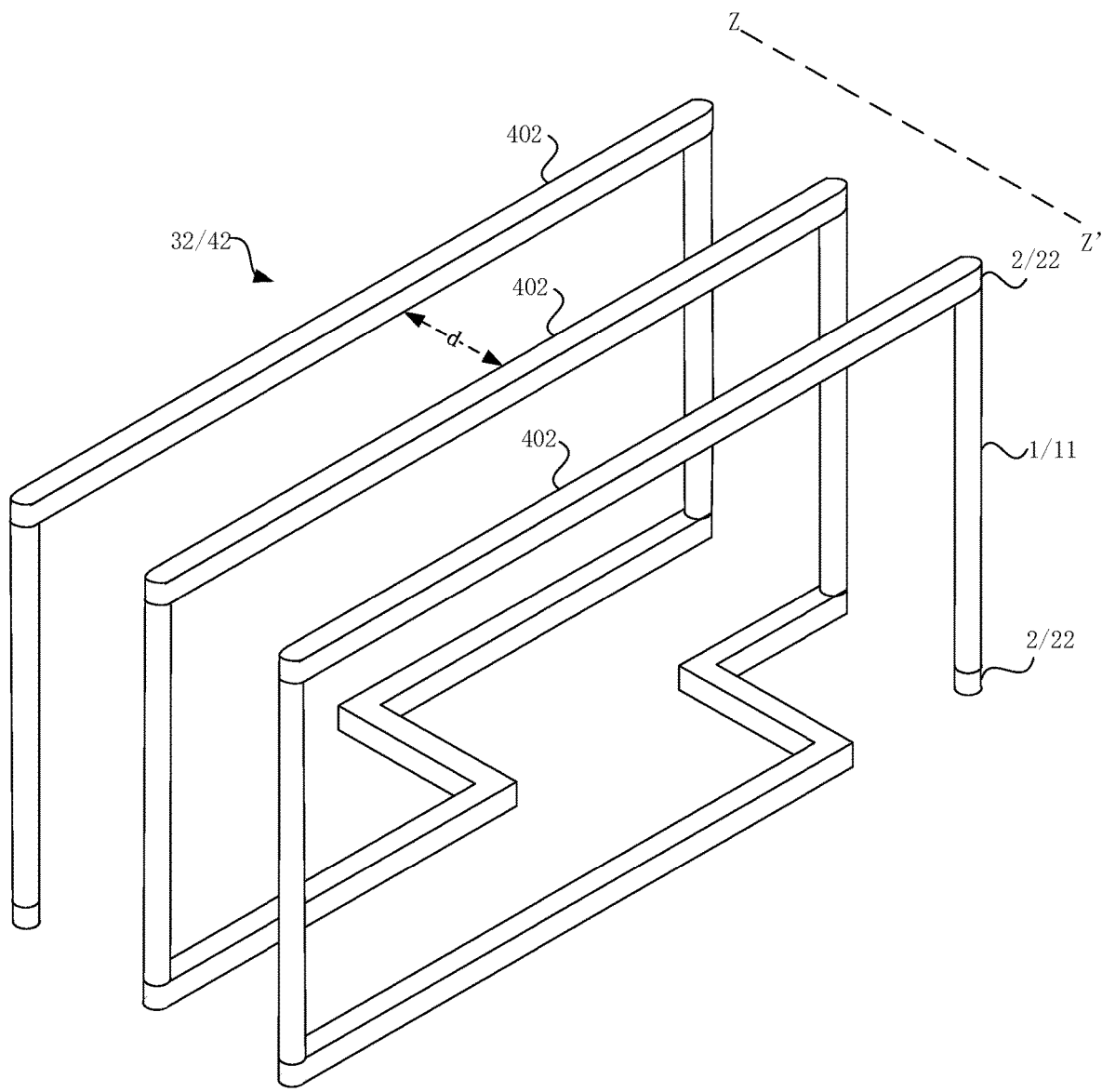
FIG. 3 is a stereoscopic structure diagram of a second inductive element in another frequency multiplexer provided by an embodiment of the present disclosure.

FIG. 3 is a stereoscopic structure diagram of a second inductive element in another frequency multiplexer provided by an embodiment of the present disclosure. In an embodiment, as shown in FIG. 3, the second spiral coil structure 42 includes a plurality of second monolayer planar spiral coil structures 402 along the axial direction ZZ' of the second spiral coil structure 42. A thickness of a second dielectric structure between two adjacent second monolayer planar spiral coil structures 402 may be greater than a thickness of each second monolayer planar spiral coil structure 402. The thickness of the second dielectric structure between the two adjacent second monolayer planar spiral coil structures 402 is the distance between two upright monolayer planar spiral coil structures 402. Similarly, comparing with a configuration where the thickness of each second monolayer planar spiral coil structure is equal to the thickness of the second dielectric structure under the inductive element with the same thickness, a configuration that the thickness of the second dielectric structure between the two adjacent second monolayer planar spiral coil structures 402 is greater than the thickness of each second monolayer planar spiral coil structure 402 increases the distance between the two adjacent second monolayer planar spiral coil structures 402. This decreases the coupling between adjacent second monolayer planar spiral coil structures 402 along the axial direction ZZ' of the second spiral coil structure 42 due to small distance between adjacent second monolayer planar spiral coil structures 402 and increases the resonance frequency of the second inductive element 32.

It should be noted that FIG. 2 and FIG. 3 show only two examples of the second inductive element. The present disclosure does not limit the specific shape and winding mode of the second inductive element, as long as the axial direction XX' of the first multilayer planar spiral coil structure 41 intersects with the axial direction YY' of the second spiral coil structure 42.

Figure 4:
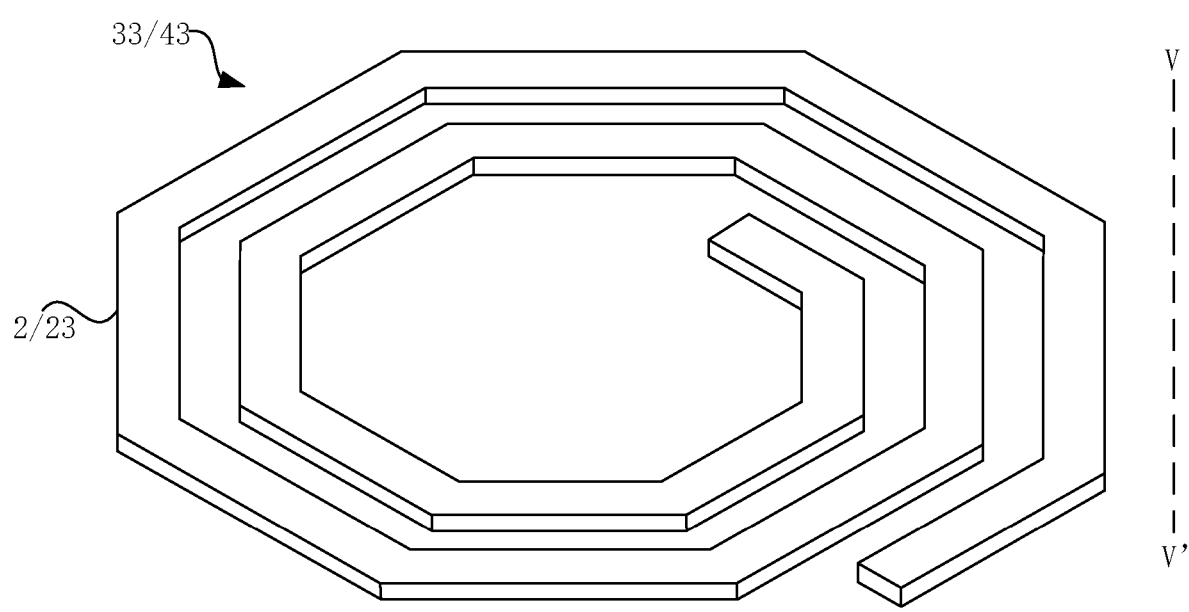
FIG. 4 is a stereoscopic structure diagram of a third inductive element in a frequency multiplexer provided by an embodiment of the present disclosure.
Figure 5:
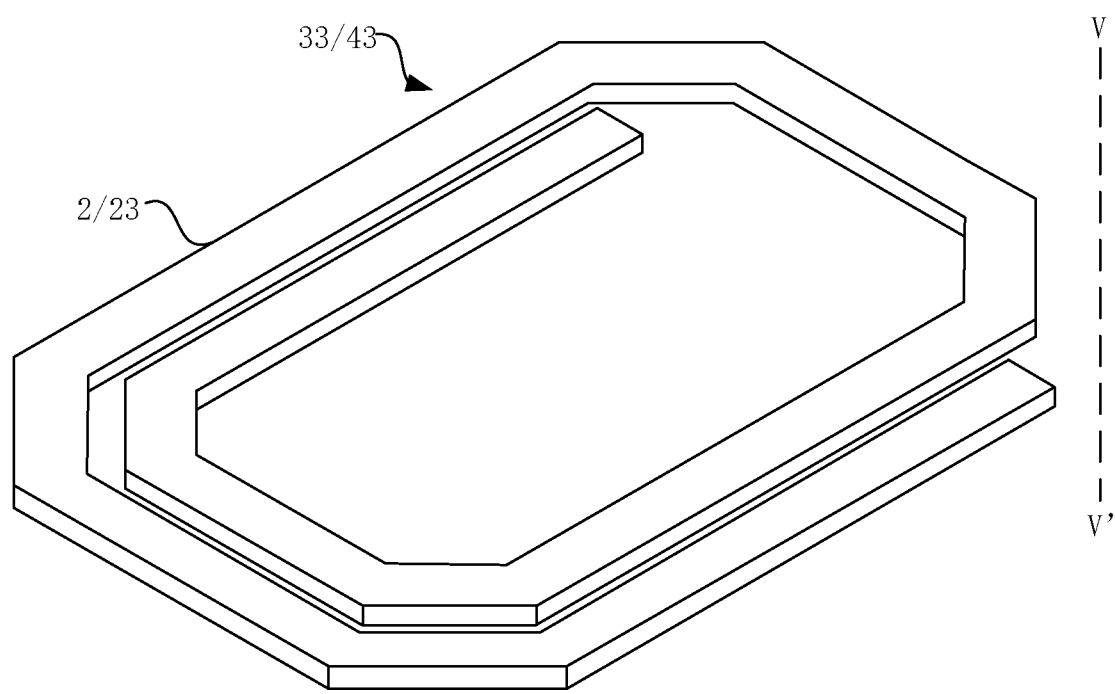
FIG. 5 is a stereoscopic structure diagram of a third inductive element in another frequency multiplexer provided by an embodiment of the present disclosure.

FIG. 4 is a stereoscopic structure diagram of a third inductive element in a frequency multiplexer provided by an embodiment of the present disclosure. As shown in FIG. 4, the stacked structure may further form at least one third inductive element 33. The third patterned metal structure 23 in a metal layer 2 forms a third monolayer planar spiral coil structure 43. The third monolayer planar spiral coil structure 43 is the third inductive element 33. The third inductive element 33 constituted by the monolayer planner spiral coil structure may achieve smaller inductance than the structures of the inductive elements shown in FIG. 1 to FIG. 3. The third inductive element 33 may meet a requirement of the frequency multiplexer for inductance with different values. It should be noted that the embodiment of the present disclosure does not limit the specific shape of the third monolayer planar spiral coil structure 43. The specific shape of the third monolayer planar spiral coil structure 43 may be as shown in FIG. 4 or FIG. 5. For the consideration of a semiconductor manufacturing process, the interior angles for bending metal wires that form the coil structure may be set to 135°. In addition, combining with FIG. 4 and FIG. 5, the axial direction VV' of the third multilayer planar spiral coil 43 may also be configured to intersect with the axial direction ZZ' of the second spiral coil 42, or the axial direction VV' of the third multilayer planar spiral coil 43 may be configured to be perpendicular to the axial direction ZZ' of the second spiral coil 42, so as to reduce the coupling between the third inductive element 33 and the second inductive element 32 and further optimize the out-of-band rejection characteristic of the frequency multiplexer.

In an embodiment, a capacitive element may be formed of overlapping part of fourth patterned metal structures in two adjacent metal layers along a direction perpendicular to a plane of the stacked structure. The insulating layer between two fourth patterned metal structures may serve as a dielectric layer of a capacitive structure. In this way, the stacked structure configured with metal layers and insulating layers may form the inductive element and the capacitive element simultaneously. A corresponding relation between the inductive element and the capacitive element may be implemented through a via in the corresponding insulating layer. For example, the structure of the first inductive element 31 shown in FIG. 1 and the structure of the third inductive element 33 shown in FIG. 5 may be configured in the high-pass branch of the frequency multiplexer, and the structure of the second inductive element 32 shown in FIG. 2 or FIG. 3 and the structure of the third inductive element 33 shown in FIG. 4 may be configured in the low-pass branch of the frequency multiplexer. Each inductive element is electrically connected with the corresponding capacitive element.

It should be noted that the present disclosure does not limit the specific number of the inductive elements and the capacitive elements in the frequency multiplexer and the specific connection relation between the inductive elements and the capacitive elements. Those skilled in the art may configure the number of the inductive elements and the capacitive elements, and the connection relation between the inductive elements and the capacitive elements according to requirements.

The frequency multiplexer provided by the present disclosure includes a stacked structure. The stacked structure includes at least one insulating layer 1 and a plurality of metal layers 2 arranged alternately along the stacked direction XX'. The stacked structure forms at least one first inductive element 31 and at least one first capacitive element. At least two of the plurality of metal layers 2 are provided with respective first patterned metal structures 21. The first patterned metal structures in the at least two of the plurality of metal layers are electrically connected to form the first multilayer planar spiral coil structure 41. The first multilayer planar spiral coil structure 41 constitutes the first inductive element 31. In this way, the at least one insulating layer 1 and the plurality of metal layers 2 arranged alternately along the stacked direction XX' in the stacked structure are used for forming the first multilayer plane spiral coil structure 41, that is, the at least one first inductive element 31 in the frequency multiplexer. This is beneficial to obtaining of larger inductance in smaller size, that is, miniaturization of the first inductive element 31 and then miniaturization of the frequency multiplexer. At the same time, the first inductive element 31 in the frequency multiplexer may be fabricated using the semiconductor process, which is beneficial to precise control of the size of the first inductive element 31, increase of the precision of inductance of the first inductive element 31, increase of the conductance of the first inductive element 31, reduction of the resistance of the first inductive element 31, increase of the Q value of the first inductive element 31 in the frequency multiplexer and reduction of the loss of the frequency multiplexer.

What is claimed is:

1. A frequency multiplexer, comprising:
a stacked structure, wherein the stacked structure comprises at least one insulating layer and a plurality of metal layers arranged alternately along a stacked direction in the order of one metal layer and one insulating layer, and the stacked structure forms at least one first inductive element and at least one capacitive element;
wherein at least two of the plurality of metal layers are provided with respective first patterned metal structures, the first patterned metal structures in the at least two of the plurality of metal layers are electrically connected to form a first multilayer planar spiral coil structure, and the first multilayer planar spiral coil structure constitutes the first inductive element;
wherein the stacked structure further forms at least one second inductive element;
at least two of the plurality of metal layers are provided with respective second patterned metal structures, the second patterned metal structures in the at least two of the plurality of metal layers are electrically connected to form a second spiral coil structure, and the second spiral coil structure constitutes the second inductive element;
an axial direction of the first multilayer planar spiral coil structure intersects with an axial direction of the second spiral coil structure.

2. The frequency multiplexer of claim 1, wherein the first multilayer planar spiral coil structure comprises a plurality of first monolayer planar spiral coil structures along the axial direction of the first multilayer planar spiral coil structure, and a thickness of a first dielectric structure between two adjacent first monolayer planar spiral coil structures is greater than a thickness of each first monolayer planar spiral coil structure.

3. The frequency multiplexer of claim 1, wherein the first multilayer planar spiral coil structure comprises a plurality of first monolayer planar spiral coil structures along the axial direction of the first multilayer planar spiral coil structure, and the first multilayer planar spiral coil structure forms a structure comprising at least one coil.

4. The frequency multiplexer of claim 1, wherein the axial direction of the first multilayer planar spiral coil structure is perpendicular to the axial direction of the second spiral coil structure.

5. The frequency multiplexer of claim 1, wherein the first inductive element is configured in a first branch of the frequency multiplexer, and the second inductive element is configured in a second branch of the frequency multiplexer.

6. The frequency multiplexer of claim 1, wherein the second spiral coil structure is a multilayer spiral coil structure.

7. The frequency multiplexer of claim 6, wherein the second spiral coil structure comprises a plurality of second monolayer planar spiral coil structures along the axial direction of the second spiral coil structure, and a thickness of a second dielectric structure between two adjacent second monolayer planar spiral coil structures is greater than a thickness of each second monolayer planar spiral coil structure.

8. The frequency multiplexer of claim 1, wherein the stacked structure further forms at least one third inductive element, a third patterned metal structure in one of the plurality of metal layers forms a third monolayer planar spiral coil structure, and the third monolayer planar spiral coil structure constitutes the at least one third inductive element.

9. The frequency multiplexer of claim 1, wherein the at least one capacitive element is formed of overlapping parts of fourth patterned metal structures in two adjacent metal layers of the plurality of metal layers along a direction perpendicular to a plane of the stacked structure.

* * * * *